United States Patent [19]

Ichihara

[11] Patent Number: 5,533,064
[45] Date of Patent: Jul. 2, 1996

[54] DIGITAL RADIO RECEIVER HAVING LIMITER AMPLIFIERS AND LOGARITHMIC DETECTOR

[75] Inventor: Masaki Ichihara, Tokyo, Japan

[73] Assignee: NEC Corporation, Japan

[21] Appl. No.: 203,875

[22] Filed: Feb. 24, 1994

Related U.S. Application Data

[63] Continuation of Ser. No. 782,666, Oct. 25, 1991, abandoned.

[30]    Foreign Application Priority Data

Oct. 25, 1990 [JP] Japan .................... 2-285750

[51] Int. Cl.$^6$ ............................. H03D 1/00; H04L 27/06
[52] U.S. Cl. .................... 375/340; 375/346; 455/296
[58] Field of Search .......................... 329/304; 375/316, 375/349, 346, 340, 232, 230, 324; 455/296, 303, 308, 52.1

[56]    References Cited

U.S. PATENT DOCUMENTS

| | | | |
|---|---|---|---|
| 4,090,150 | 5/1978 | Vachenauer | 330/302 |
| 4,197,501 | 4/1980 | Gammel et al. | 455/303 |
| 4,988,951 | 1/1991 | Tomita | 329/345 |
| 5,048,059 | 9/1991 | Dent | 375/102 |

FOREIGN PATENT DOCUMENTS 2179810  3/1987  United Kingdom .

OTHER PUBLICATIONS

IEEE International Conference on Communications, Suzuki et al., Boston ICC 11–14 Jun. 1989; "High Bit Rate Digital Mobile Radio Transmission With a Decision Feedback Equalizser," pp. 171–172.

*Primary Examiner*—Stephen Chin
*Assistant Examiner*—Hai H. Phan
*Attorney, Agent, or Firm*—Ostrolenk, Faber, Gerb & Soffen

[57]    ABSTRACT

In a digital radio receiver, an amplitude limiter circuit (20, 21) is included for producing a constant-amplitude IF signal from a received digitally modulated IF signal. An orthogonal detector (22) orthogonally mixes the constant-amplitude signal with a reference carrier and produces a in-phase baseband signal and a quadrature-phase baseband signal. The baseband signals are converted to first and second digital signals (24, 25) and supplied to multipliers (26, 27), respectively. A logarithmic. detector circuit (30) is coupled to the amplitude limiter (20) for generating a signal representative of the amplitude of the received IF signal. The logarithmic scale of the amplitude signal is converted to linear scale by a logarithmic-to-linear converter circuit (32, 33) and supplied to the multipliers (26,27) in which it is multiplied with the digital baseband signals. The outputs of the multipliers are coupled to an equalizer (28) for eliminating bit errors. The outputs of the equalizer (28) are then directed to the demodulator (29) for recovering the modulating signal.

9 Claims, 2 Drawing Sheets

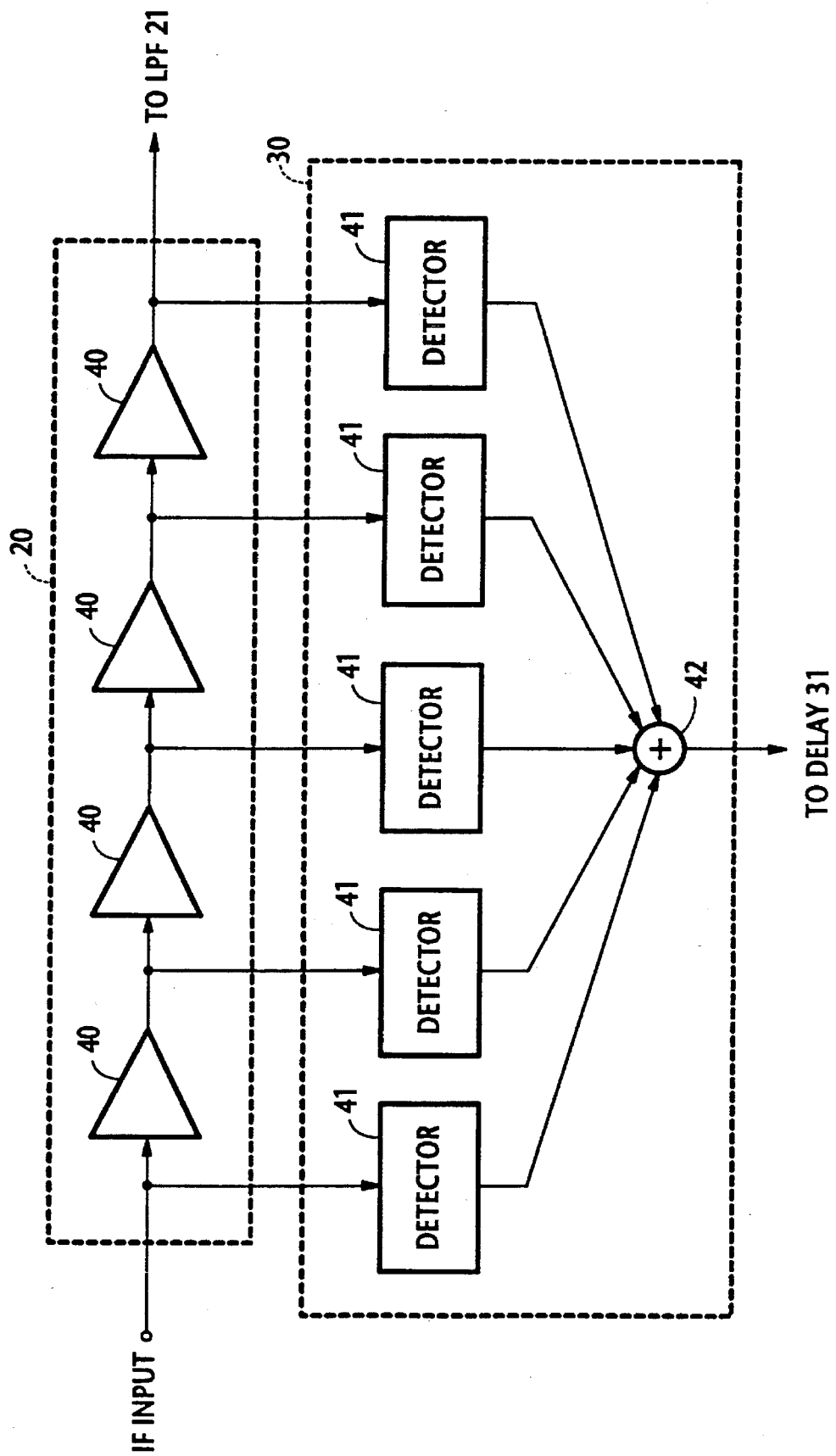

2,533,064

DIGITAL RADIO RECEIVER HAVING LIMITER AMPLIFIERS AND LOGARITHMIC DETECTOR

This is a continuation of application Ser. No. 07/782,666 filed on Oct. 25, 1991 abandoned.

BACKGROUND OF THE INVENTION

The present invention relates generally to digital radio communications systems, and more specifically to a digital radio receiver for mobile communications systems in which the receiver suffers from multipath fading and interference.

In digital mobile radio, orthogonal modulation techniques are employed for conveying TDM (time division multiplex) signals. To overcome bit errors caused by multipath fading and interference, the maximum likelihood sequence estimation technique is used. A known digital radio receiver includes a linear amplifier for linearly amplifying IF (intermediate frequency) input signal to produce an output $X \cdot \cos(2\pi f_c t + \theta t)$, where X is the amplitude of the IF input, $f_c$ is the carrier frequency and t is a time variable. An orthogonal detector provides mixing of the amplifier output with a local carrier $A \cdot \cos 2\pi f_c t$ for detecting the in-phase baseband component ($I = aX \cdot \cos \theta t$) and the quadrature-phase baseband component ($Q = aX \cdot \sin \theta t$) of the transmitted signal, where A is the amplitude of the local carrier, where a is a constant and the phase component $\theta t$ contains the information to be conveyed. After conversion to digital form, the I and Q signals are fed into a digital demodulator to recover the transmitted information using the MLSE adaptive equalization technique. In the adaptive equalization process the amplitude component 'aX' provides useful information for eliminating bit errors caused by multipath fading and interference. However, with mobile radio the amplitude component 'aX' varies significantly with the length of signal propagation path as well as with variations characteristic of the individual path, giving a variation range of 80 dB in a worst condition. Because of the wide dynamic range, the amplitude components 'aX' of the baseband signals cannot properly be represented by digital signals of a practical bit length. Although the long-term variations of the I and Q signals may be significantly compressed by the use of an AGC (automatic gain controlled) amplifier instead of the linear IF amplifier, by appropriately proportioning the AGC time constants, the short-term variations are passed through the AGC amplifier and produce quantum noise. Therefore, the prior art demodulator cannot be used for mobile communications system where the distance between source and destination and the signal propagation path are continually varying and signals suffer from multipathfading-related interference.

SUMMARY OF THE INVENTION

It is therefore an object of the present invention to provide digital demodulation of orthogonal digital baseband signals suitable for mobile communication systems.

According to the present invention, an amplitude limiter circuit is included for producing at a constant value a first output signal representative of the amplitude of a received digitally modulated signal. An orthogonal detector provides orthogonal mixing of the constant-amplitude signal with a reference carrier and produces a first baseband signal in phase with the reference carrier and a second baseband signal in quadrature phase with the reference carrier. The first and second baseband signals are converted to first and second digital signals, respectively, and supplied to multipliers. A logarithmic detector circuit is coupled to the amplitude limiter for producing a second output signal representative of the amplitude of the modulated signal. A logarithmic-to-linear converter circuit is coupled to the logarithmic detector for converting the logarithmic scale of the amplitude representative second output signal to linear scale. The first and second digital signals are multiplied with the linear-scale amplitude representative signal and supplied to a digital equalizer for eliminating bit errors arising from multipath fading and interference. To the output of the equalizer is connected a digital demodulator for producing a replica of the modulating signal.

In a preferred embodiment, the amplitude limiter circuit comprises a series of tapped limiter amplifiers for defining successive tap points, and the logarithmic detector comprises a plurality of detectors coupled respectively to the tap points of the amplitude limiter and an adder for summing the outputs of the detectors to produce the amplitude representative signal.

BRIEF DESCRIPTION OF THE DRAWINGS

The present invention will be described in further detail with reference to the accompanying drawings, in which:

FIG. 2 is a circuit diagram illustrating details of the amplitude limiter and logarithmic detector of FIG. 1.

DETAILED DESCRIPTION

Figure 1:
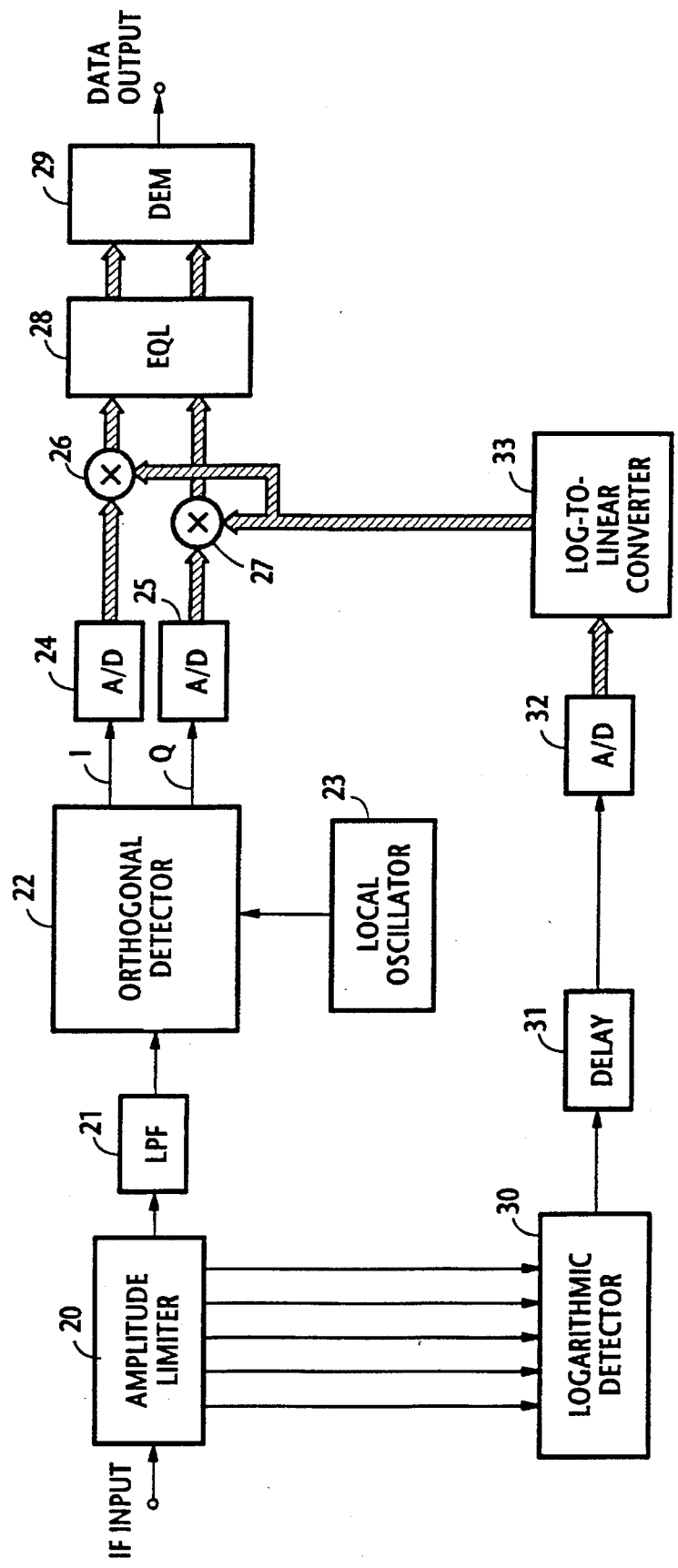
FIG. 1 is a block diagram of a digital radio receiver according to the present invention.

Referring now to FIG. 1, there is shown a digital radio receiver according to present invention. The receiver comprises an amplitude limiter 20 for limiting the amplitude varying range of an IF input signal and producing a constant-amplitude signal for coupling to a low-pass filter 21 to remove harmonic components produced as a result of the nonlinear relationship between the input and output of amplitude limiter 20. The output of filter 21 is fed into an orthogonal detector 22 in which it is mixed with a local carrier supplied from oscillator 23 to produce an I signal ($I = a \cdot \cos \theta t$) and a Q signal ($Q = a \cdot \sin \theta t$). These baseband signals are converted to digital form by A/D converters 24 and 25, the outputs of which are coupled to multipliers 26 and 27, respectively. An MLSE equalizer 28 is coupled to the outputs of multipliers 26, 27 to produce equalized I and Q signals for coupling to a demodulator 29.

Since both I and Q signals contain no trace of the amplitude component 'X' mentioned previously, they are applied to A/D converters 24 and 25 at an optimum level by appropriately determining the integer 'a'. A logarithmic detector 30 is connected to the amplitude limiter 20 to logarithmically detect the IF signal and produce a DC signal indicative of the amplitude of the IF input signal. The DC output of logarithmic detector 30 is coupled to a delay circuit 31 so that its output signal is synchronized with the I and Q signals. The delayed signal is applied to an A/D converter 32 and converted to digital form and applied to a logarithmic-to-linear converter 33 in which the logarithmic scale of the amplitude representative signal is converted to a linear scale and applied to multipliers 26 and 27 in which they are multiplied with the digital I and Q signals. Because of the amplitude limiting action of limiter 20, no trace of amplitude component of the IF signal is contained in the I and Q baseband signals, and thus the outputs of multipliers 26 and 27 contain no components other than those useful for equalization.

A preferred form of the amplitude limiter 20 and logarithmic detector 30 is shown in FIG. 2. As illustrated, the amplitude limiter 20 comprises a plurality of limiter amplifiers 40. Amplifiers 40 are series-connected to form successive tap points between the IF input terminal and the input of low-pass filter 21. The logarithmic detector 30 comprises a plurality of detectors 41 connected respectively to the tap points of amplitude limiter 20. The outputs of detectors 41 are summed by an adder 42 to produce the amplitude representative signal for coupling to delay circuit 31. Each of the limiting amplifiers 40 has an amplification gain of 10 dB so that the dynamic range of the IF signal is determined by the product of the value of 10-dB and the number of the limiting amplifier stages. For a given dynamic range of the tF input signal, the resolution of the amplitude representative signal increases with respect to the logarithmic amplitude as a function of the number of limiter stages with a decreasing value of amplification gain.

What is claimed is:

1. A digital radio receiver comprising:

an amplitude limiter for receiving an orthogonally modulated signal and producing a constant-amplitude version of the received signal;

an orthogonal detector coupled to said amplitude limiter for orthogonally mixing the constant-amplitude signal with a reference carrier and producing a first baseband signal in phase with said reference carrier and a second baseband signal in quadrature phase with said reference carrier;

an analog-to-digital converter for converting said first and second baseband signals to first and second digital baseband signals, respectively;

a logarithmic detector coupled to said amplitude limiter for generating a signal representative of the amplitude of the orthogonally-modulated signal received by the amplitude limiter;

a logarithmic-to-linear converter for converting the logarithmic scale of said amplitude-representative signal to a linear scale;

a multiplier for multiplying the first and second digital baseband signals with the linear-scale amplitude-representative signal from the logarithmic-to-linear converter;

an equalizer coupled to said multiplier for equalizing the multiplied first and second digital baseband signals to produce first and second equalized digital signals; and a demodulator coupled to said equalizer for recovering a modulating signal from said first and second equalized digital signals.

2. A digital radio receiver as claimed in claim 1, wherein said amplitude limiter comprises a series of tapped limiter amplifiers for defining successive tap points, and wherein said logarithmic detector comprises a plurality of detectors coupled respectively to said tap points and an adder for summing outputs of the detectors to produce said amplitude-representative signal.

3. A digital radio receiver as claimed in claim 2, wherein said limiter amplifiers have about equal values of amplification gain.

4. A digital radio receiver as claimed in claim 1, wherein said equalizer is a maximum likelihood sequence estimation equalizer.

5. A digital radio receiver as claimed in claim 1, wherein the orthogonally-modulated signal received by the amplitude limiter is an IF (intermediate frequency) signal, and a constant-amplitude version of the received IF signal is produced by the amplitude limiter.

6. A digital radio receiver comprising:

an amplitude limiter for receiving an orthogonally-modulated signal and producing a constant-amplitude version of the received signal, the limiter having a series of tapped limiter amplifiers for defining successive tap points;

an orthogonal detector coupled to said amplitude limiter for orthogonally mixing the constant-amplitude signal with a reference carrier and producing a first baseband signal in phase with said reference carrier and a second baseband signal in quadrature phase with said reference carrier;

an analog-to-digital converter for converting said first and second baseband signals to first and second digital baseband signals, respectively;

a plurality of detectors each coupled in to a respective one of said successive tap points for generating a signal representative of the amplitude of the orthogonally-modulated signal received by the series of tapped limiter amplifiers;

an adder for summing outputs of the plurality of detectors to produce the amplitude-representative signal;

a logarithmic-to-linear converter for converting the logarithmic scale of said amplitude-representative signal to a linear scale;

a multiplier for multiplying the first and second digital baseband signals with the linear-scale amplitude-representative signal from the logarithmic-to-linear converter;

an equalizer coupled to said multiplier for equalizing the multiplied first and second digital baseband signals to produce first and second equalized digital signals, respectively; and a demodulator coupled to said equalizer for recovering a modulating signal from said first and second equalized digital signals.

7. A digital radio receiver as claimed in claim 6, wherein said limiter amplifiers have about equal values of amplification gain.

8. A digital radio receiver as claimed in claim 6, wherein said equalizer is a maximum likelihood sequence estimation equalizer.

9. A digital radio receiver as claimed in claim 6, wherein the orthogonally modulated signal received by the amplitude limiter is an IF (intermediate frequency) signal, and a constant-amplitude version of the received IF signal is produced by the amplitude limiter.

\* \* \* \* \*